United States Patent [19]

Melia

[11] Patent Number: 4,506,212

[45] Date of Patent: Mar. 19, 1985

[54] METHOD AND APPARATUS FOR TESTING INTEGRATED CIRCUITS USING AC TEST INPUT AND COMPARISON OF RESULTING FREQUENCY SPECTRUM OUTPUTS

[75] Inventor: Alan J. Melia, Ipswich, England

[73] Assignee: The Post Office, London, England

[21] Appl. No.: 173,743

[22] Filed: Jul. 30, 1980

[30] Foreign Application Priority Data

Aug. 2, 1979 [GB] United Kingdom ............... 7927009

[51] Int. Cl.³ ...................... G01R 15/12; G01R 27/00
[52] U.S. Cl. ............................... 324/73 R; 324/57 SS
[58] Field of Search ............ 324/73 R, 73 AT, 57 SS; 307/356, 526, 527; 371/20, 25

[56] References Cited

U.S. PATENT DOCUMENTS 3,602,809  8/1971  Tarui et al. ....................... 324/73 R
3,723,868  3/1973  Foster ............................. 324/73 AT
4,055,801  10/1977 Pike et al. ....................... 324/73 AT
4,129,826  12/1978 Mills ............................... 324/57 SS

OTHER PUBLICATIONS

Jacobsen, "Swept-Frequency . . . " Hewlett-Packard Journal vol. 29, No. 9, May 1978, p. 24.

*Primary Examiner*—Gerard R. Strecker
*Assistant Examiner*—Walter E. Snow
*Attorney, Agent, or Firm*—Cushman, Darby & Cushman

[57] ABSTRACT

An integrated circuit is tested by applying to it the output of a clocked word generator. The resulting output from the circuit is analyzed by a phase sensitive detector comprising a series of sampling switches and integrators which are synchronized with the generator frequency. The output spectrum is compared with that of a reference to evaluate the quality of the circuit.

4 Claims, 3 Drawing Figures

METHOD AND APPARATUS FOR TESTING INTEGRATED CIRCUITS USING AC TEST INPUT AND COMPARISON OF RESULTING FREQUENCY SPECTRUM OUTPUTS

This invention relates to the testing of integrated circuits.

Integrated circuits are used extensively in many applications. In many cases the circuits, e.g. MOS type circuits, rely for their operation upon the storage of small quantities of charge on capacitors which form part of the integrated circuit, and the operation of the circuit can be critically dependent upon the adequate retention of this stored charge. If electrical leakage paths occur the potential across the capacitors can change with time and cause circuit misoperation and unreliability. It is therefore desirable to have a testing procedure for measuring the leakage rate of the capacitors in an integrated circuit.

It has been proposed to test integrated circuits by measuring the d.c. current supply to two integrated circuits under a variety of different input states. One of the circuits is under test whilst the other is a standard reference circuit of known quality. The current drawn by the circuits is compared for each of the different input states. A faulty circuit is indicated by the fact that it draws a different current from that drawn by the reference circuit.

We have developed a technique for testing integrated circuits which employs a.c. as opposed to d.c. signals. The technique has the advantage that it is more sensitive than a d.c. technique and exhibits noise cancellation.

According to one aspect of the present invention there is provided a method of testing integrated circuits comprising applying an alternating logic signal to an integrated circuit, measuring the spectrum of the resulting output waveform, and comparing that spectrum with the corresponding spectrum of a reference circuit. A defective circuit is indicated by variations in the two spectra e.g. a greater component in the spectrum of the circuit under test at the frequency of switching of a defective node. The output is not necessarily the conventional output of the circuit but can be some pin of the circuit which has a common connection to all gates in the circuit. For example in TTL logic it can be a supply pin whilst in MOS logic it can be a clock supply pin.

The alternating logic signal may be the output of a clocked word generator. The spectrum may be analysed at multiples of the frequency at which the generator is clocked. The analysis of the spectrum may be carried out using a phase sensitive detector.

According to another aspect of the present invention there is provided apparatus for carrying out the method of said one aspect, said apparatus comprising means for generating an alternating logic signal for application to an integrated circuit and means for measuring the spectrum of the output signal from the integrated circuit as a result of the application thereto of the alternating signal.

The generating means may comprise a clocked word generator. The measuring means may comprise phase sensitive detection means which is arranged to be synchronised with the generator frequency.

The invention will be described now by way of example only with particular reference to the accompanying drawings.

Integrated circuits such as large scale MOS circuits incorporate a large number of components in particular capacitors. If a circuit has any leakage paths the potential stored on one or more of its capacitors can change over a period of time and can lead to circuit malfunction. The present technique involves measuring the leakages rate of all the storage capacitors of an integrated circuit to obtain an indication of its reliability.

Figure 1:
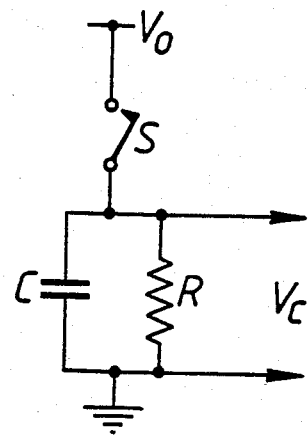
FIG. 1 is a circuit diagram for illustrating the present invention.

The principle of the technique will be explained with reference to FIG. 1 which shows a capacitor C in parallel with a leakage resistance R. If the switch is opened the voltage across the capacitor is given by $$V_c = V_0 e^{-t/RC}$$

where t is the time from the opening of the switch. By measuring $V_c$ it is possible to obtain an indication of the leakage rate of the capacitor.

Clearly it is not possible to measure the voltage across a capacitor deep within an integrated circuit. However, it is possible to deduce the rate of discharge of the capacitor by reclosing the switch S after a time t, and measuring the charge required to charge up the capacitor to Vo again. The storage capacitors within an MOS integrated circuit are relatively small, typically of the order of 1 pf, and normal leakage resistances are usually at least $10^9$ ohms. Thus the recharging current will be extremely small and difficult to measure accurately. The present technique invloves effectively continuously operating the switch S, amplifying the alternating component of the charging current and averaging the amplified component using a phase sensitive detector locked to the switch frequency.

An integrated circuit contains many switches and capacitors seen in parallel and it is not possible to isolate and charge one particular node. Thus in practice when an alternating signal is applied to an integrated circuit under test the measured recharging current is that for all capacitors. In order to evaluate the quality of the circuit it is necessary to compare the result with that for a known good circuit.

Figure 2:
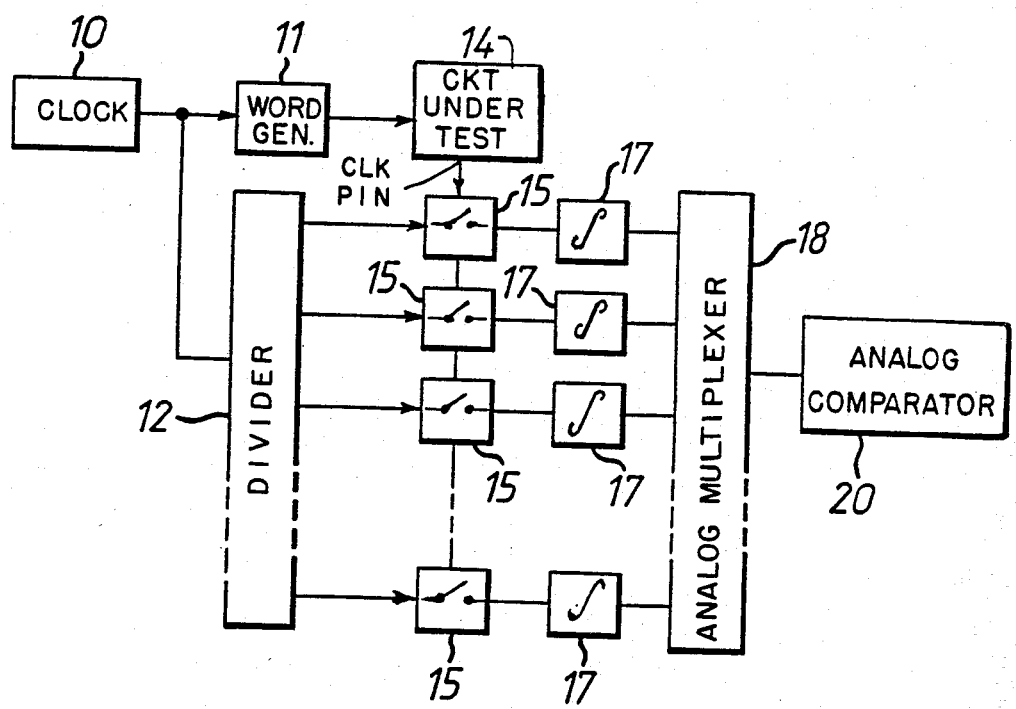
FIG. 2 is a block schematic diagram of apparatus in accordance with the present invention.

An example of a circuit which can be used to carry out the present technique is shown in FIG. 2. The circuit comprises a clock 10 which is connected to a word generator 11 and a binary divider 12. The output of the word generator 11 is connected to a circuit under test 14. A suitable output pin of the circuit 14, e.g. clock supply pin, is connected to a series of analogue sampling switches 15 which are arranged to be opened in response to signals from the divider 12. Each switch 15 is connected via an associated integrator 17 to an analogue multiplexer 18 which feeds an analogue comparator 20.

In operation, the generator 11 applies appropriate words to the circuit 14 in response to clock signals. The divider 12 applies signals to the switches 15 to allow the output from the circuit to be sampled. The output from each switch is integrated thereby causing sampled signal components not in phase with the switching waveform for that particular switch to be averaged or cancelled out. The arrangement effectively comprises a chain of phase sensitive detectors (of a previously known type, e.g. similar to that described on page 48 of "Signal Processing" by K. G. Beauchamp) whose outputs are scanned by the multiplexer 18. The comparator 20 compares the spectral density of the output waveform with that of a known good circuit (e.g. by comparing a selected multiplexer output with a reference signal corresponding to a known good circuit for the selected switch 15 measurement channel). The existence of a leakage path discharging one of the capacitors is signalled by a significantly greater component in the spectrum of the circuit under test at the frequency of switching of the defective node. Because the output spectrum is not continuous it is only necessary to investigate components which are harmonics or sub-multiples of the circuit switching frequency. Thus different switches 15 are associated with different harmonics of the basic frequency.

Figure 3:
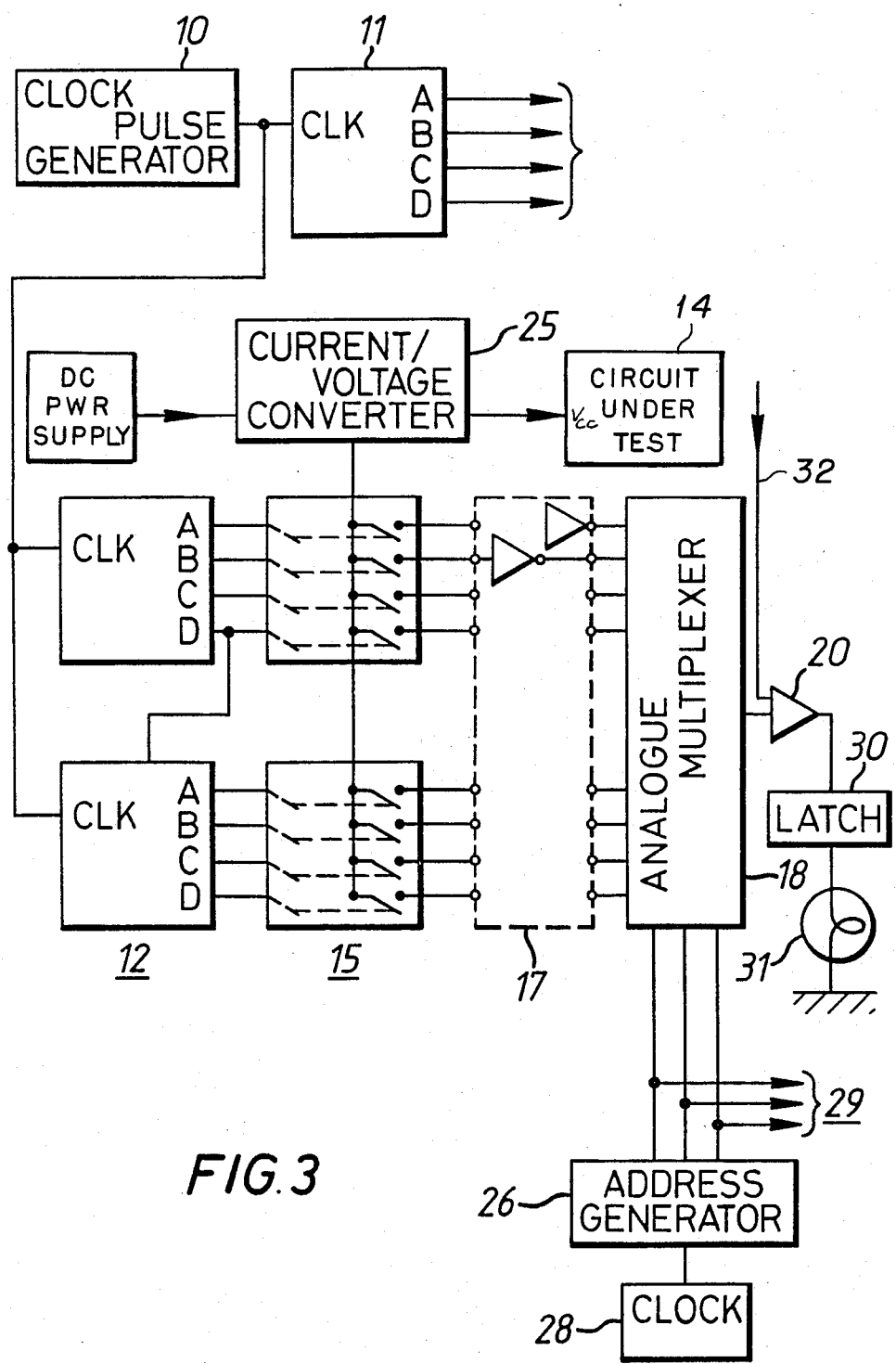
FIG. 3 shows one example of a practical implementation of the circuit of FIG. 2.

An example of a practical implementation of the circuit of FIG. 2 is given in FIG. 3. The clock 10 is a TTL clock pulse generator (Type 7413) and the word generator 11 is a Type 7493 device. The drive signal for the circuit under test can be derived directly from the outputs ABCD, or the signal at these outputs may be used to address a Read Only Memory to generate specific complex patterns. The binary divider 12 comprises a synchronous binary counter chain (device types 74193). The switches 15 are CMOS analogue switches (device type 4066) and have a connection to a current/voltage converter 25 (Type 741) which is connected between a d.c. power supply and the Vcc pin of the circuit under test. The integrators 17 are each device type 741 with one integrator being provided for each switch.

The multiplexor 18 comprises one or more MPX-8A devices. The multiplexer is connected by an address converter 26 (Type 7493) to a clock 28 (Type 7413). Lines 29 are connected to a reference waveform generator.

The comparator 20 is a type 711. The reference signal for the comparator on line 32 may be either a fixed level signal or a complex waveform generated to simulate a non-faulty device in synchronism with the analogue multiplexer. In the latter case the reference waveform can be generated by a similar analogue multiplexer (driven, as noted above, by lines 29 from the common address generator 26) with programmable fixed voltages applied to the inputs.

The output of the comparator 20 is connected to a flip-flop latch 30 (Type 7475) which is arranged to illuminate a lamp 31 when a faulty device is detected.

I claim:

1. A method of testing integrated circuits having data input and data output pins and also having other electrical connection pins, said method comprising the steps of:
    applying an alternating logic signal and operating electrical power to an integrated circuit;
    measuring the frequency spectrum of the resulting waveform at an externally accessible electrical connector pin which is not the intended data output pin of the circuit but which is connected internally to substantially all the logic gates within the integrated circuit under test, and
    comparing that frequency spectrum with the corresponding expected frequency spectrum.

2. A method as claimed in claim 1 wherein the alternating logic signal is the output of a clocked word generator.

3. A method as claimed in claim 2 wherein the compared spectrums are analyzed using a phase sensitive detector to measure the frequency spectrum of the integrated circuit under test.

4. Apparatus for testing circuit devices with plural gate elements having associated capacitance and including at least one externally accessible electrical common connector pin, of the clocking pin and voltage supply pin type, which is internally connected to substantially all said gate elements of the integrated circuit, said apparatus comprising:
    generator means for generating a repetitive sequence of alternating logic signals of predetermined frequency to be applied to the input(s) of the integrated circuit device under test; and
    frequency spectrum analyzing means for connection to said common connector pin of the integrated circuit and synchronized with said generator means for measuring the frequency spectrum of common connector electrical responses by measuring the magnitude of common connector electrical responses to the alternating logic signal input at said predetermined frequency and harmonics or sub-multiples thereof;
    wherein said generator means comprises a clock driven word generator and wherein said frequency spectrum analyzing means comprises (1) a divider chain driven by the clock of the generator means, (2) plural integrator means, (3) a current/voltage converter with its current sensitive input connected to said common connector, (4) plural switches individually controlled by respectively corresponding stages of said divider chain and connected between respectively corresponding ones of said integrator means and the controlled voltage output of said current/voltage converter, (5) multiplexer means having respective inputs connected to a corresponding output of said integrator means, and (6) comparator means having an input connected to a multiplexed output of said multiplexer means.

* * * * *